US012140508B2

(12) United States Patent
Rizvi et al.

(10) Patent No.: US 12,140,508 B2
(45) Date of Patent: Nov. 12, 2024

(54) SYSTEMS AND METHODS FOR CONDITION MONITORING

(71) Applicant: Green Running Limited, Bath (GB)

(72) Inventors: Raza Rizvi, Bath (GB); Doruk Uzunoglu, Bath (GB); Peter Davies, Bath (GB)

(73) Assignee: Green Running Limited, Bath (GB)

( * ) Notice: Subject to any disclaimer, the term of this patent is extended or adjusted under 35 U.S.C. 154(b) by 43 days.

(21) Appl. No.: 17/266,850

(22) PCT Filed: Aug. 9, 2019

(86) PCT No.: PCT/EP2019/071502
§ 371 (c)(1),
(2) Date: Feb. 8, 2021

(87) PCT Pub. No.: WO2020/030812
PCT Pub. Date: Feb. 13, 2020

(65) Prior Publication Data
US 2021/0293666 A1     Sep. 23, 2021

(30) Foreign Application Priority Data

Aug. 10, 2018    (GB) .................................... 1813093

(51) Int. Cl.
*G01R 13/02*     (2006.01)
*G01M 99/00*     (2011.01)
(Continued)

(52) U.S. Cl.
CPC ....... *G01M 99/005* (2013.01); *G01R 13/0272* (2013.01); *G06N 3/048* (2023.01); *G06N 3/088* (2013.01)

(58) Field of Classification Search
CPC ............. G01M 99/005; G01R 13/0272; G06N 3/0481; G06N 3/088
See application file for complete search history.

(56) References Cited

U.S. PATENT DOCUMENTS 6,170,333 B1      1/2001   Jinnai et al.
2003/0220767 A1  11/2003   Wegerich
(Continued)

FOREIGN PATENT DOCUMENTS

| GB | 2520628 A | 5/2015 |
| JP | 2001-74799 A | 3/2001 |
| JP | 2002-281658 A | 9/2002 |

(Continued)

OTHER PUBLICATIONS

E. Cabal-Yepez et al., "Smart Sensor for Electrical Machine Monitoring through Statistical Analysis." Electrical Machines (ICEM), 2012 XXth International Conference ON, IEEE, Sep. 2, 2012, pp. 2505-2511.
H.O.A. Ahmed et al., "Intelligent Condition Monitoring Method for Bearing Faults from Highly Compressed Measurements Using Sparse Over-Complete Features." Mechanical Systems and Signal Processing, vol. 99, pp. 459-477, 2018.
(Continued)

*Primary Examiner* — Manuel A Rivera Vargas
(74) *Attorney, Agent, or Firm* — Blank Rome LLP

(57) ABSTRACT

A method for monitoring the status of an apparatus comprises processing in a processor a cyclic signal emitted and/or received by said apparatus, by sampling at least part of a plurality of cycles of the cyclic signal at n points to provide n measured values; comparing the n measured values to a predetermined distribution of values at said n points representing a first state of the apparatus; and if the n measured values fall outside predetermined criteria relating to the predetermined distribution, providing an indication that the apparatus is not in the first state.

19 Claims, 12 Drawing Sheets

(51) Int. Cl.
*G06N 3/048* (2023.01)
*G06N 3/088* (2023.01)

(56) References Cited

U.S. PATENT DOCUMENTS

| | | |
|---|---|---|
| 2008/0033693 A1 | 2/2008 | Andenna et al. |
| 2013/0138257 A1* | 5/2013 | Edenfeld .............. G01R 31/088 700/287 |
| 2013/0148817 A1* | 6/2013 | Moriya .................. H04R 29/00 381/56 |
| 2014/0149325 A1 | 5/2014 | Clifton et al. |
| 2014/0172400 A1 | 6/2014 | Majewski et al. |
| 2016/0232723 A1 | 8/2016 | Karlsson et al. |
| 2016/0275045 A1 | 9/2016 | Boutaud |
| 2019/0324070 A1* | 10/2019 | Saneyoshi ......... H02J 13/00006 |

FOREIGN PATENT DOCUMENTS

| | | |
|---|---|---|
| TW | I 627 387 B | 6/2018 |
| WO | WO 2012/167013 A1 | 12/2012 |
| WO | WO 2018/039648 A1 | 3/2018 |

OTHER PUBLICATIONS

E. Marchi et al., "A Novel Approach for Automatic Acoustic Novelty Detection Using a Denoising Autoencoder with Bidirectional LSTM Neural Networks." Proceedings—ICASSP, IEEE International Conference on Acoustics, Speech and Signal Processing, pp. 1996-2000, 2015.

M. Afgani et al., "Anomaly Detection using the Kullback-Leibler Divergence Metric", 2008 First International Symposium on Applied Sciences on Biomedical and Communication Technologies, Oct. 25, 2008, pp. 1-5.

* cited by examiner

SYSTEMS AND METHODS FOR CONDITION MONITORING

FIELD OF THE INVENTION

The present invention relates to a condition-based learning and condition-based monitoring system and method, and more particularly to a condition-based learning and condition-based monitoring method to learn and/or monitor the condition of an apparatus based on a cyclic signal emitted and/or received by said apparatus.

BACKGROUND

The primary aim of maintenance is to prevent the failure of equipment. A primitive, yet widely employed, method of carrying this out is by means of "preventive maintenance" which involves the servicing or systematic inspection of equipment in order to correct incipient failures prior to developing into full blown failures. Preventive maintenance can be applied to many devices, particularly devices that have known failure modes that can be prevented with regular maintenance, and also devices whereby the likelihood of failure increases as a result of time and/or use. A typical example of preventive maintenance is the replacement of an internal combustion engine's cambelt as used in a motorcar—the usual failure mode is stripped teeth which causes a drive cog to slip, however, the risk of this can be reduced by simply replacing the cambelt prior to a threshold number of miles being exceeded by the motorcar whereby the threshold value is typically determined empirically from measuring the number of miles drivable without the cambelt's teeth being stripped away. However, preventive maintenance is less suitable for devices or components that can fail unpredictably, e.g. circuit boards.

An alternative to preventative maintenance is "predictive maintenance"; this differs from preventive maintenance in that the condition of equipment is determined and scheduling corrective maintenance is driven by the condition of the equipment rather than the expected life or maximum use of the equipment. Therefore, the frequency of maintenance can be reduced in comparison with normal preventative maintenance, without sacrificing reliability. This type of maintenance requires condition monitoring, i.e. observing the state of a system. Predictive maintenance prompts condition-based maintenance to try to maintain the correct equipment at the right time. An advantage of condition monitoring is that it can be performed while equipment is still in operation, therefore minimising any downtime.

US2014172400, to HONEYWELL INTERNATIONAL INC., relates to a system for detecting faults and diagnostics of equipment. The system is capable of disaggregation and/or virtual submetering of energy consumption in a building, such as that of heating, lighting in a building. Vibration and current sensors, along with at least one algorithm, may be utilised for fault detection and diagnostics of equipment. Models may be developed to aid in deducing energy consumption of individual components of equipment, and the like, for a building.

In Ahmed et al. (Mechanical Systems and Signal Processing 99 (2018) 459-477), the authors describes an intelligent condition monitoring method using sparse over-complete features. This method monitors a cyclic signal but needs to know what "faulty" state looks like beforehand in order to improve computational performance to classify faults.

In Marchi et al. (Proceedings—ICASSP, IEEE International Conference on Acoustics, Speech and Signal Processing, 2015), the authors aims to identify signals which were not observed in a training phase. It does this by using an autoencoder which has more nodes in the hidden layer than there are inputs which would typically means that the network learns the identity function, i.e. the output equals the input. However, Marchi et al. use a "denoising" autoencoder which corrupts the data on purpose by turning some of the input values to zero. Then when calculating the loss function, the output values need to be compared with the actual input values rather than the corrupted input so there is no risk of the network learning the identity function instead of extraction features.

WO2012167013, to Imo Industries, Inc., describes a system and method for monitoring the operation of a wide variety of machinery by using a plurality of temperature and vibration sensors coupled to a controller. The controller receives input from the sensors and determines whether the temperature and vibration levels are within acceptable ranges with respect to baseline values. If the levels fall outside the acceptable ranges, a user is alerted as such.

There is clearly a need for a system or method of monitoring an apparatus that emits or receives a cyclic signal in an operational state and determining the existence of a fault without necessarily having knowingly observed a faulty state. Additionally, there is a need for a system which can automatically monitor and determine the operational status of a piece of equipment, e.g. whether a washing machine is on a spin cycle or wash cycle.

SUMMARY OF THE INVENTION

In one option, the present invention provides a method for monitoring the status of an apparatus by processing in a processor a cyclic signal emitted and/or received by said apparatus, comprising the steps: (i) sampling at least part of a plurality of cycles of the cyclic signal at n points to provide n measured values; and (ii) comparing the n measured values to a predetermined distribution of values at said n points representing a first state of the apparatus; and (iii) if the n measured values fall outside predetermined criteria relating to the predetermined distribution, providing an indication that the apparatus is not in the first state.

Optionally, or additionally, the present invention provides a method for monitoring the status of an apparatus by processing in a processor a cyclic signal emitted and/or received by said apparatus, comprising the steps: (i) repeatedly sampling at least part of a plurality of cycles of the cyclic signal at n points to provide n measured values for each repetition and thereby generate a statistical distribution of measured values; and (ii) comparing the statistical distribution of the measured values with a predetermined distribution representing a first state of the apparatus; and (iii) if the statistical distribution of the measured values fall outside predetermined criteria relating to the predetermined distribution, providing an indication that the state of the apparatus is not the same as the first state of the apparatus. Further optionally, or additionally, the present invention provides a method for providing a statistical distribution or predetermined statistical distribution for use in at least one of the above methods of monitoring the status of an apparatus by processing in a processor a measured cyclic signal emitted or received by an apparatus, comprising the steps: (i) repeatedly sampling at least part of a plurality of cycles of the cyclic signal at n points within each sampled part of the cyclic signal to provide n values for each repetition; and (ii) forming a statistical distribution of at least one of the n points of the n values across the repeatedly sampled parts of the cyclic signal; and (iii) storing the statistical distribution of the n values in a database; whereby a statistical distribution indicative of the state of the apparatus is obtained.

In some options of the present invention, the n sampled points of the cyclic signal are mapped onto a fixed signal at n points to provide the n measured values. The fixed signal may be produced by a stochastic process, for example, a random walk. The cyclic signal is mapped onto the fixed signal by means of a function approximator, or a computer program for function approximation, for example an artificial neural network, e.g. an autoencoder. The sampled cyclic signal is inputted into the function approximator, and the function approximator comprises a fixed signal within it such that the output of the function approximator should be of the inputted signal mapped onto the fixed signal.

In some options of the present invention, the points are frequency intervals in a frequency spectrum representative of the cyclic signal emitted and/or received by the apparatus.

The present invention also relates to devices, data products and systems as defined in the claims.

DETAILED DESCRIPTION

Figure 1:
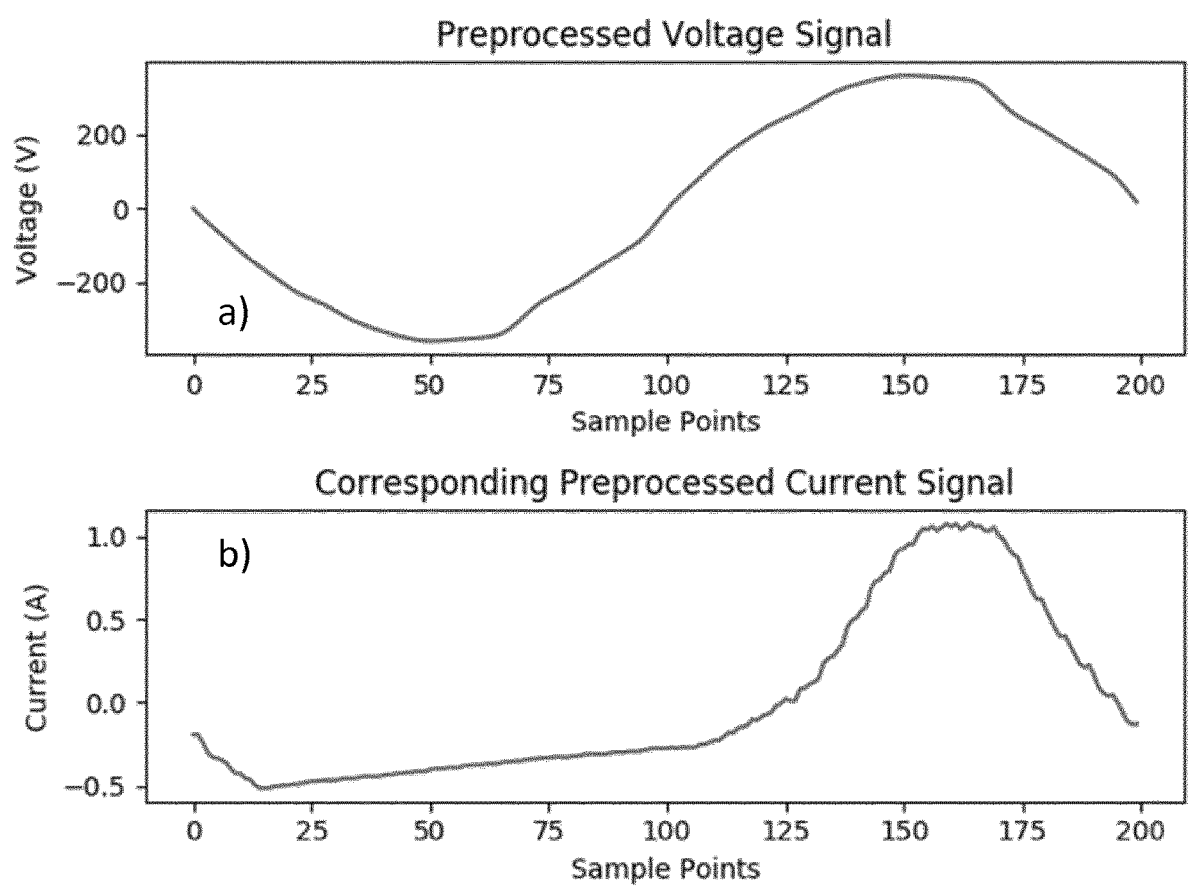
FIG. 1 is a graphical representation example of sampling and pre-processing the cyclic signal.

The present invention relates to a system and method for monitoring the condition of equipment from a cyclic signal emitted or received by said equipment. The cyclic signal may be an electrical AC (alternating current) signal, cyclic/pulsating DC signal, or any other type of cyclic signal for example an acoustic, vibrational, or electromagnetic signal.

A signal is a function conveying information about the behaviour of attributes of some phenomenon, e.g. audio, image, communication, geophysical etc. In the present invention, a cyclic signal emitted and/or received by an apparatus can be analysed to monitor the condition of said apparatus. Prior to analysing the cyclic signal emitted and/or received by the apparatus, the apparatus must be in at least one state which is known. If the apparatus being learnt is, for example, a washing machine, it may be in at least one known state, for example, a spin cycle or a wash cycle whereby each state may be represented by a different signal which is emitted and/or received by the apparatus. Therefore, the first process of the analysis is to "learn" the signal behaviour in at least one known state. The use of "cyclic" with respect to the signal may be used interchangeably with "periodic" or "near-periodic" throughout this document. The cyclic signal referred to herein is emitted and/or received, either directly or indirectly (via, for example, a transducer), by an apparatus suitable for having its condition monitored, for example, but not limited to, an electrical appliance (which receives an electrical AC signal) or a mechanical apparatus (which emits a vibrational or acoustic signal).

The methods disclosed herein may be provided by a learning processing system and/or a monitoring processing system to execute the method (whereby the method is implemented by software). Optionally, the learning processing system and the monitoring processing system are provided by at least one shared processor. Further optionally, the learning processing system and the monitoring processing system are each provided by at least one separate processor, i.e. a learning system processor and/or a monitoring system processor, respectively. References to "processor" in this document describe either a shared processor or a separate processor. The methods of the present invention can be implemented by software, and at least one of the methods may include computer code provided to a general purpose computer on any suitable carrier medium. The carrier medium can comprise a storage medium, (for example a floppy disk, a CD ROM, a magnetic device or a programmable memory device or a programmable logic device) or a transient medium such as any signal, e.g. an electrical, optical, or microwave signal. The carrier medium comprising the software is in communication with the at least one processor.

In one option of the present invention, the at least one processor is part of a power plug for the electrical apparatus. The power plug for the electrical apparatus is used to couple the apparatus to an electrical power source, directly or indirectly, for example an AC power supply. Optionally, or additionally, the at least one processor is part of a wall socket or outlet (i.e. a power point). Optionally, or additionally, the at least one processor is part of the apparatus itself, i.e. the processor is in-line with the apparatus. Optionally, or additionally, the at least one processor is remote from the apparatus and is in communication with said apparatus via Wi-Fi, Bluetooth, Zigbee, Z-Wave or any other wired or wireless permissible communications, for example, the processor is comprised by a smart meter, a wireless router, or a remote server in communication with a computer network, i.e. "the cloud".

The at least one processor in any of the above options may form part of an integrated circuit, for example a "system on a chip" (SoC), said integrated chip comprising a processor (e.g. a microprocessor or a field programmable logic array), a memory (e.g. RAM), input/output ports and a data storage medium.

Measuring or observing a cyclic signal can be performed using any suitable means, for example, a current clamp for an electrical signal or a microphone for an audio signal. For measuring or observing an electrical cyclic signal, a current clamp may be implemented directly within the apparatus' power source or its connection to the power source. For example, a current clamp, sensor, transducer and/or any other suitable measurement equipment may be placed directly within a power plug and/or a socket for coupling an electrical apparatus to an electric power supply. Optionally, a current clamp, sensor, transducer and/or any other suitable measurement equipment may be comprised by the apparatus itself. The measurements may be stored in a database, whereby the database is stored on a computer-readable medium. The computer readable medium may be in communication with the at least one processor.

The apparatus can be any domestic apparatus, for example a refrigerator, a television or a washing machine for a home or the apparatus can be any industrial apparatus, for example power tools or mechanical pumps.

The present invention in its learning mode can be applied either in space or time-domain or frequency-domain, or a combination of both. The space or time-domain method will be described first, followed by the analogous frequency-domain method. It is perfectly implicit to a person skilled in the art that some aspects of the space or time-domain method of the present invention can be employed in conjunction with some elements of the frequency-domain method of the present invention.

Learning Mode

The learning mode of the present invention is presented below. The learning mode may be described as a method for providing a statistical distribution by processing a cyclic signal emitted and/or received by an apparatus in a first state. The learning mode may be provided and/or processed by the learning processing system.

Measuring or observing a cyclic signal can be performed using any suitable means, for example, a current clamp for an electrical signal or a microphone for a audio signal. For measuring or observing an electrical cyclic signal, a current clamp may be implemented directly within the apparatus' power source or its connection to the power source. For example, a current clamp, sensor, transducer and/or any other suitable measurement equipment may be placed directly within a power plug and/or a socket for coupling an electrical apparatus to an electric power supply. Optionally, a current clamp, sensor, transducer and/or other suitable measurement equipment may be comprised by the apparatus itself.

A cyclic or periodic or near-periodic signal may be sampled, i.e. a continuous function V of continuous variable t is reduced to a discrete function $V_k$ of discrete sampling variable $t_k$, where t is time or space, and k=integer signal. This may also be regarded as digitising an analogue signal. This is advantageous as the data can easily be stored in a database. The database may be stored within the carrier medium. An example of signal sampling is the conversion of a sound wave (a continuous-time signal) to a sequence of samples (a discrete-time signal). It may be preferable to sample only a single wavelength (cycle) of the cyclic signal, or at least part of a plurality of wavelengths (cycles) of the cyclic signal. For the purposes of the present invention, any sampling technique may be used including, but not limited to, impulse sampling, natural sampling or flat top sampling.

Additionally, or alternatively, a frequency spectrum may also be used to represent a signal in spatial or temporal-domain by performing a Fourier transform (or Laplace transform) on the spatial or temporal-domain signal. It may be preferable to use a Fourier or Laplace transformation to extract information in frequency-domain and subsequently filter any unwanted frequencies by, for example, a low and/or high pass filter, and then perform an inverse Fourier or Laplace transformation such that the cyclic wave in space or time-domain may then be used without the need for pre-processing. This will be discussed in more detail below.

Each sampled signal may comprise a cyclic or periodic or almost periodic waveform. The sampling interval may be a fixed or variable value of space or time. For example, an AC current signal with a utility frequency of 50 Hz (or 60 Hz) will require a sample rate of 10000 Hz (or 12000 Hz) in order to have 200 discrete points in each wavelength. The sampling intervals should be chosen to provide good discrimination between different states of the apparatus. Sample rates of >2, >5, >10, >50, >100 times a frequency of the signal, or even more, provide increasing discrimination. If the highest frequency of the cyclic signal is known, the preferred minimum sampling rate is the Nyquist sampling rate. The Nyquist sampling rate is twice the highest frequency present in the signal.

Optionally, after sampling the cyclic signal, the sample may be subjected to pre-processing. Pre-processing utilises functions that allow the denoising, smoothing and detrending of signals in order to prepare them for further analysis. This is done by removing noise, outliers and spurious content from raw signal. Pre-processing may be undertaken computationally or via hardware methods whereby the signal is passed through at least one hardware component, for example, a low pass filter.

Either before or after sampling the cyclic signal, the signal may be "broken down" into single cycles, i.e. single wavelengths or partial wavelengths. The cyclic signal may be formed by a cyclostationary process. Given the value of the frequency of a signal, the signal may be broken down into constituent waves wherein each wavelength is defined as all of the points from crest to crest (or trough to trough) (or between any two corresponding points on adjacent waves/cycles) (or, in the example of an AC signal, all of the points from the positive to negative zero crossing to a subsequent positive to negative zero crossing, or vice versa, or from a positive to negative zero crossing to a subsequent negative to positive zero cross, or vice versa). As an example, a single cycle with a frequency of 50 Hz sampled at a rate of 10000 Hz will have 200 discrete points per cycle, i.e. 200 data points. This can be done for each single cycle of the signal. FIG. 1 shows one example of sampling and pre-processing the cyclic signal. The voltage signal in FIG. 1a is "cut" such that only the part of the cyclic signal that goes from a first zero crossing to a subsequent zero crossing is used for sampling, and the corresponding AC signal in FIG. 1b is extracted from this.

In an optional, or additional, aspect of the present invention, the learning mode may provide a method for providing a statistical distribution by processing a cyclic signal emitted and/or received by an apparatus in a first state which is converted from space- or time-domain to frequency domain by applying, for example, a Fourier transformation or a Laplacian transformation to the original space or time-domain signal. Ideally the signal has been sampled at a sample rate of at least the Nyquist frequency, i.e. the sample rate is at least twice the maximum component frequency present in the signal emitted and/or received by the apparatus. At least a part of a plurality of a cyclic signal may be sampled in space or time-domain as described above, and then transformed into frequency domain by means of, for example, a Fourier transform or a Laplace transform. Each resulting frequency spectrum may be broken down into p intervals, each interval comprising a range of frequencies. This process of sampling at least a part of a plurality of a cyclic signal in time domain and then transforming the space or time-domain signal into frequency-domain comprising p intervals may be repeated, i.e. a frequency spectrum corresponding to the at least part of a plurality of cyclic signals comprises p intervals. By repeating this process, statistical quantities, e.g. the mean and/or standard deviation, can be found for each $p^{th}$ interval allowing the $p^{th}$ frequency interval to be distributed by a statistical distribution defined by any of the determined statistical quantities.

Central limit theorem states that if we sample m points from any distribution and average these m points and repeat this process n times, the n averaged points will form a statistical distribution (i.e. normal distribution) approximately centred on the true mean of the original distribution. Therefore, continuing with the example above, we may optionally average, say, 10 single cycles each with 200 data points to create an averaged single cycle of 200 averaged data points. In addition, this process may optionally be repeated a plurality of times, for example 150 times. Therefore we now have 150 averaged single cycles produced from the 150 sets of 10 single cycles. As we know each single cycle is created from, for example, 200 data points, we may create a statistical distribution of each of these 200 data points. It is important to note that the "single cycle" does not need to be precisely a single cycle, but can be a plurality of cycles or at least part of a plurality of cycles. Although the term "single cycle" is used in this document for the sake of consistency, the skilled person in the art of signal processing would be aware that this can be applied to a plurality of cycles or at least part of a plurality of cycles.

So, to clarify the above example, we have 150 averaged "single cycles" where each averaged single cycle comprises 200 data points. This information can be used to find a statistical distribution for each data point via central limit theorem or any other suitable statistical theory. We may find the mean and/or standard deviation at an nth data point by measuring the nth data point of each of the 150 averaged single cycles. Once the mean and/or standard deviation is found for the nth data point, the nth data point may be distributed by a statistical distribution (for example, a normal distribution) defined by the mean and standard deviation determined. This may be done for all 200 (n) data points comprised by each of the 150 averaged single cycle such that we have 200 (n) statistical distributions, or optionally, a machine learning model or algorithm, for example a random forest or other decision support tool, may be employed such that only the optimal or necessary or required data points will have a corresponding distribution created. Alternatively, a user may define the number of data points to create a corresponding distribution for. Statistical data, for example the values of the mean and standard deviation, may be stored onto a database, wherein the database is stored on a carrier medium, wherein the carrier medium is a computer-readable medium. The statistical data (for example the values of the mean and standard deviation) may be used in the monitoring stage.

Figure 2:
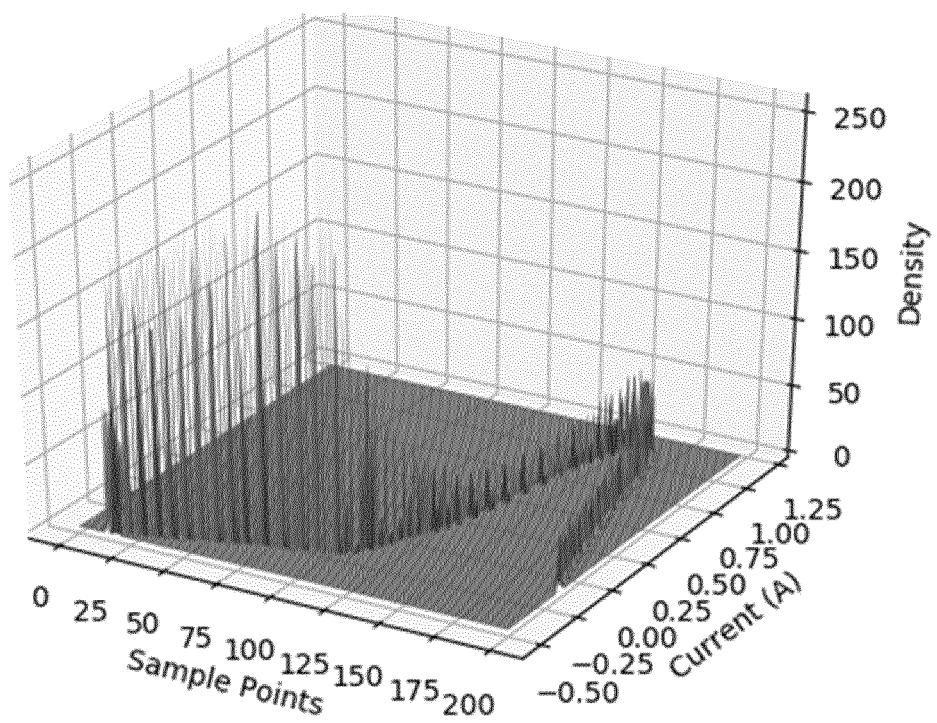
FIG. 2 is a 3-D graphical representation of the probability density function of the normal distributions for every sample point in the at least part of a plurality of cyclic signals.

FIG. 2 shows a 3-D graphical depiction of the probability density function of the normal distributions for every sample point in the at least part of a plurality of cyclic signals. Each "spike" in density corresponds to a probability density function of the normal distribution related to that data point. A high density at a particular data point implies that the current varies less than at a data point where there is a lower density.

Figure 3:
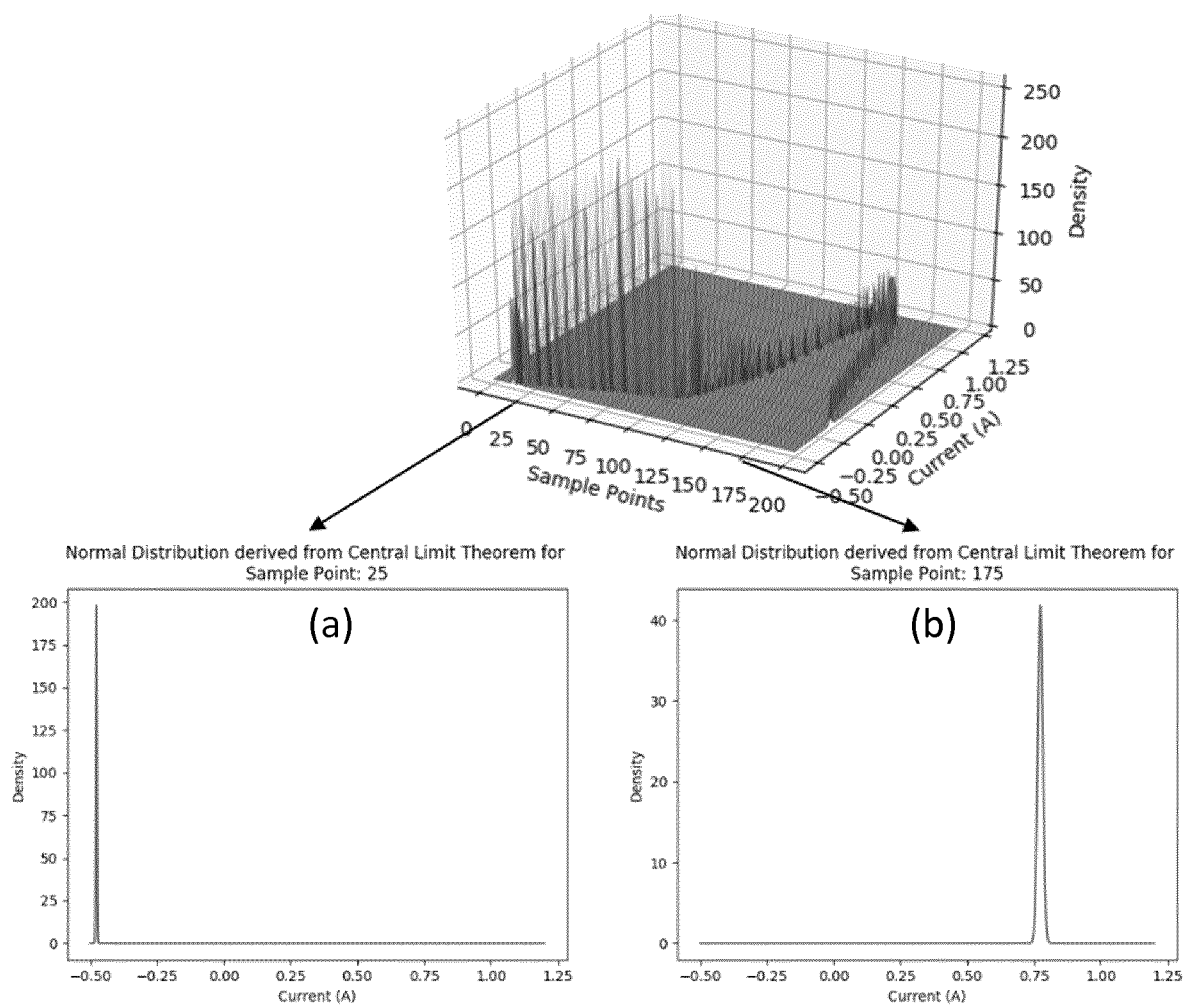
FIG. 3 is a 2-D graphical representation of the 3-D graph of FIG. 2 at sample points (data points) n=25 and n=175.

FIGS. 3a and 3b show 2-D graphical representations of the 3-D graph of FIG. 2 at sample points (data points) n=25 and n=175, respectively. This distribution is useful to "test" whether a new incoming signal in a second state is likely to come from the learnt distribution for each sample point (as will become more apparent in the monitoring aspect of the present invention).

Figure 4:
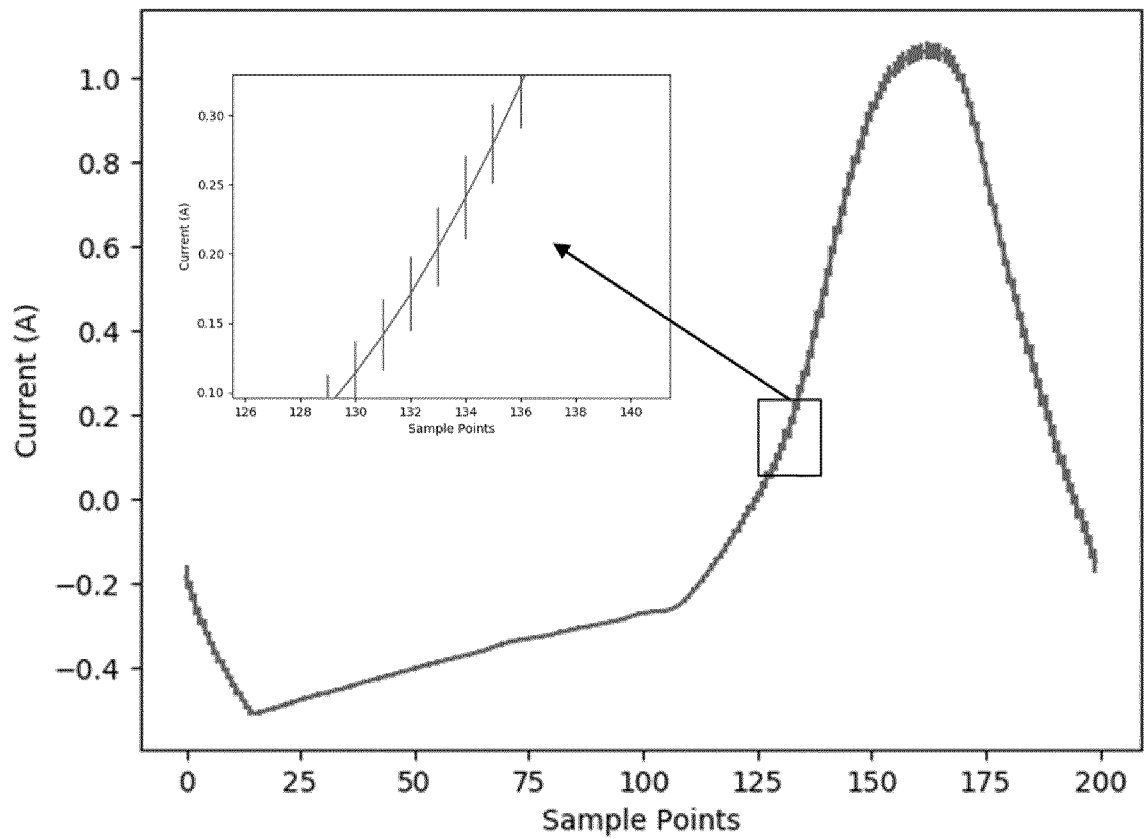
FIG. 4 is a graphical representation of an example of the learnt means and standard deviations associated with each sample point of the at least part of a plurality of cyclic signals.

FIG. 4 shows an example of a learnt means (the continuous line) and standard deviations associated with each sample point (short vertical lines in the inset) of the at least part of a plurality of cyclic signals. If a data point falls outside of these error bars, then we know that the likelihood of it arriving from the learnt distribution is less than a predetermined likelihood, e.g. 0.3%. This method creates a variable "envelope" around the mean signal. The width of the envelope at any given sample point is a function of the variance within the learnt data at that sample point.

Optionally, or additionally, in the frequency-domain case, the statistical distribution may be similarly created using central limit theorem or any other suitable statistical technique. This may be done for at least some of the $p^{th}$ frequency intervals, or optionally, a machine learning model or algorithm, for example a random forest or other decision support tool, may be employed such that only the optimal or necessarily or required intervals will have a corresponding distribution created. The statistical data, for example each mean and standard deviation value, may be stored onto a database, wherein the database may be stored on a computer-readable medium. The statistical data, and therefore the statistical distribution, may be used in the monitoring stage. An advantage of learning the signal in frequency domain is that the pre-processing does not need to be carried out in the same way that it may be carried out in the space or time-domain learning mode. This is essentially an identical method of obtaining a plurality of statistical distributions representing the cyclic signal to the space or time-domain case, however, it applied to intervals (i.e. frequency ranges) rather than data points.

It is important to note that the number of single cycles from which the averaged single cycle is produced may be any number, including one such that the single cycle is not averaged. It is also important to note that the process of producing the averaged single cycle need not be repeated, and if it is repeated, it may have any number of repetitions, not necessarily 150.

Monitoring Mode in Space or Time-Domain

The monitoring mode of the present invention is for monitoring the condition of apparatus while said apparatus is in operation in a second state. The monitoring mode may be provided by the monitoring system processor.

Once the distribution of the at least one data point in a single cycle is known, i.e. a learnt distribution in a first state of the apparatus, we can test (i.e. 'monitor') another measured cyclic signal emitted and/or received by said apparatus in a second state. By sampling the cyclic signal in the same way as done for the first state (following the same example as given in the 'Learning mode' section whereby a signal emitted and/or received by an apparatus in a first state was learned), there are 200 (n) data points per single cycle. This may be done for a plurality of single cycles (or at least part of a plurality of cycles of the cyclic signal) at n points to provide n values. Following the sampling, a pre-processing procedure may be applied either computationally or via hardware. The nth point in each cycle (or at least part of a plurality of cycles of the cyclic signal) can be compared with the learnt distribution of the nth point; if more than a predetermined proportion (e.g. 95%) of values of the nth data point in a plurality of cycles (or at least part of a plurality of cycles of the cyclic signal) lie within the learnt distribution of the nth point, this may be indicative of the second state of the apparatus being the same as the first state of the apparatus. However, if less than a predetermined proportion of the nth data point in a plurality of cycles (or at least part of a plurality of cycles) lie within the learnt distribution of the nth point, this may be indicative of the second state of the apparatus being different to the first state of the apparatus. Optionally, or additionally, if the nth data point in the second state has less than a predetermined probability of originating from the learnt distribution of the nth data point, said data point may be marked as "abnormal". If the number of abnormal data points is above a predefined threshold, this may be indicative of the second state being different to the first state. If the number of abnormal data points is below a predefined threshold, this may be indicative of the second state being the same as the first state.

Optionally, or alternatively, to monitor a measured cyclic signal emitted and/or received by the apparatus in a second state, the cyclic signal may be sampled in the same way as is done for the first state, e.g. 200 ($n$) data points per single cycle (or at least part of a plurality of cycles). This process can be repeated for a plurality of single cycles (or at least part of a plurality of cycles of the cyclic signal) at n points to provide n values for each repetition. A distribution of the n data points (produced using Central limit theorem or any other suitable statistical theory, preferably by the same method for the obtaining the corresponding learnt distribution) wherein the nth distribution of each of the n distribution(s) representing the second state of the apparatus may then be compared with their corresponding nth distribution(s) representing the first state of the apparatus. If the statistical distribution representing the second state falls outside of predetermined criteria relating to the statistical distribution representing the first state, this may be indicative that the second state of the apparatus is not the same state as the first state of the apparatus, and therefore, an indication that the second state of the apparatus is not the same as the first state of the apparatus may be provided. If the statistical distribution representing the second state falls within predetermined criteria relating to the statistical distribution representing the first state, this may be indicative that the second state of the apparatus is the same as the first state of the apparatus, and therefore, an indication that the second state of the apparatus is the same as the first state of the apparatus may be provided.

Figure 5:
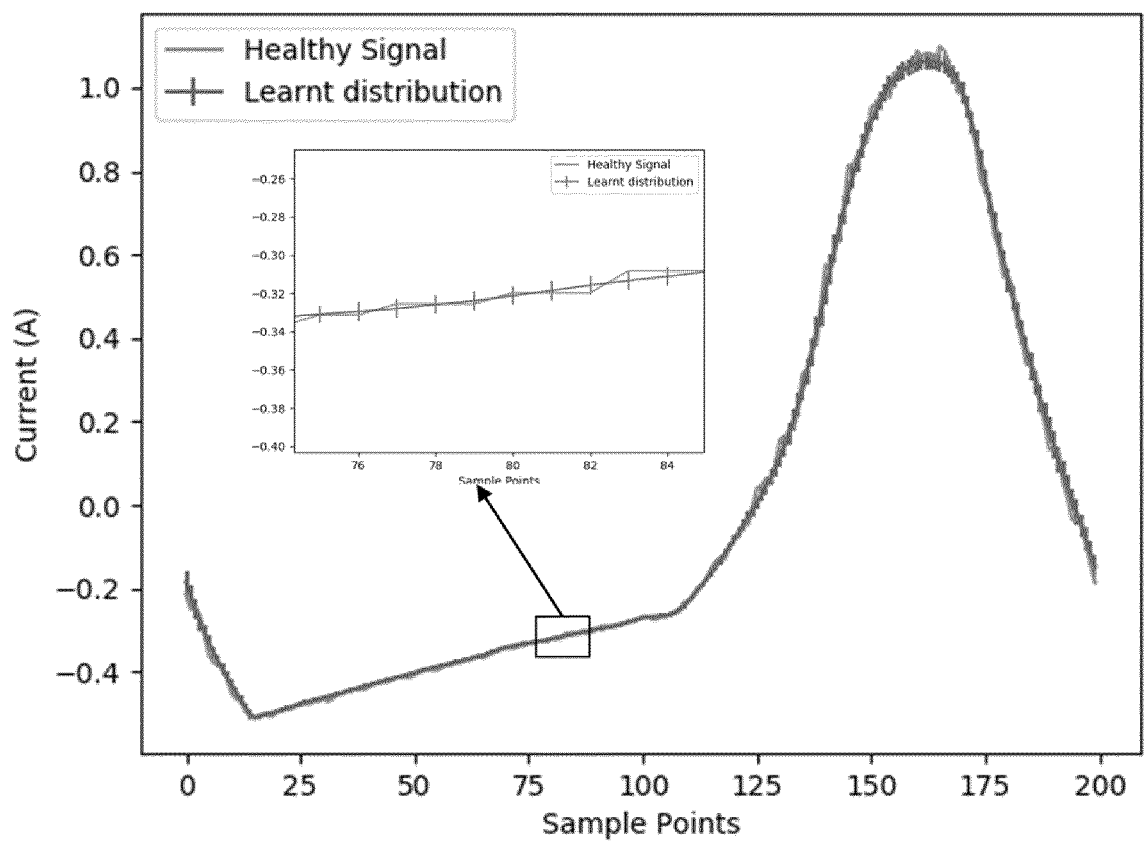
FIG. 5 is a graphical depiction of a comparison between the learnt distribution in a first state and a "healthy" signal in a second state.

FIG. 5 shows a graphical depiction of a comparison between the learnt distribution in a first state and a "healthy" signal in a second state. As the statistical distribution representing the second state falls within predetermined criteria (namely the standard deviations, i.e. error bars) relating to the statistical distribution representing the first state, this may be indicative that the second state of the apparatus is the same as the first state of the apparatus. This is usually an indication that the apparatus is "healthy". The graph of FIG. 5 shows that we can test the likelihood of an incoming signal coming from each of the learnt distributions, and can therefore quantify how certain we are that the incoming signal in a second state is healthy.

Figure 6:
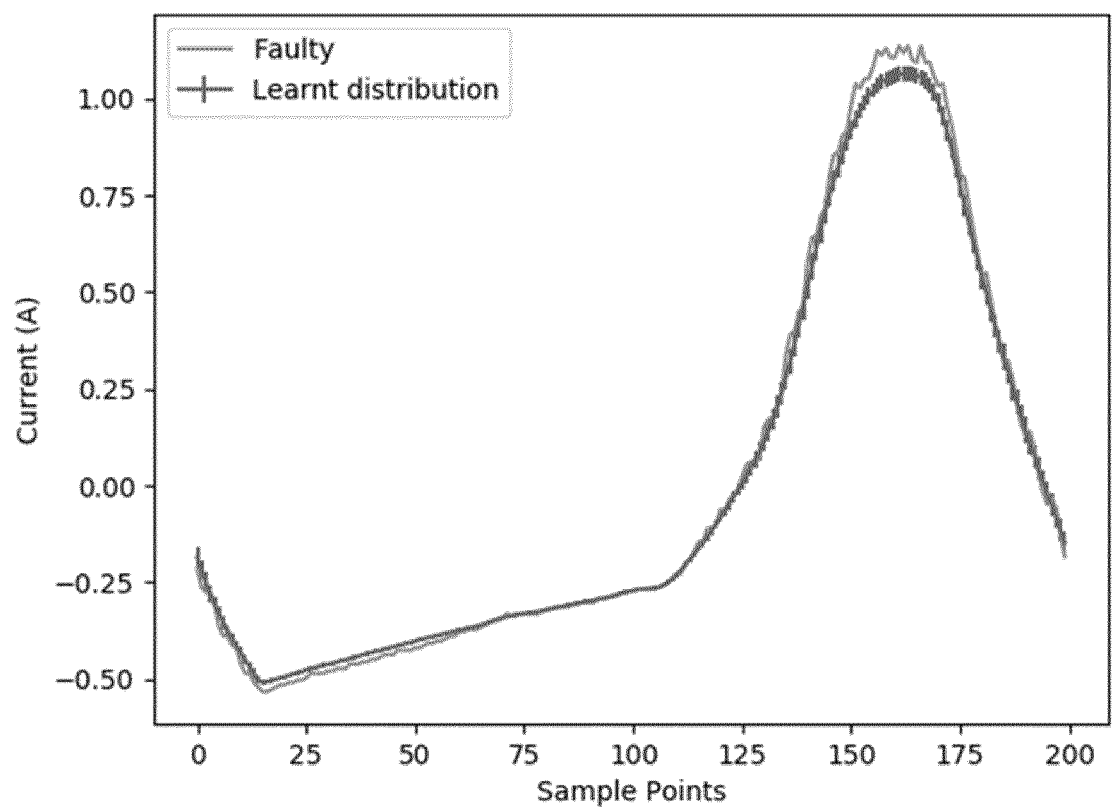
FIG. 6 is a graphical depiction of a comparison between the learnt distribution in a first state and a "faulty" signal in a second state.

Conversely, FIG. 6 shows a graphical depiction of a comparison between the learnt distribution in a first state and a "faulty" signal in a second state. As the statistical distribution representing the second state falls outside of predetermined criteria relating to the statistical distribution representing the first state, this may be indicative that the second state of the apparatus is not the same as the first state of the apparatus. This is usually an indication that the apparatus is "faulty" or "abnormal", or it can indicate that the apparatus is in a different operational state, for example if the apparatus is a washing machine, the first state may have been a wash cycle and the second state may have been a spin cycle. As most of the incoming signal representing the second state in FIG. 6 lies beyond the learnt "envelope", the second state of the apparatus can be classified as "abnormal", e.g. the probability of point 25 coming from the learnt distribution is less than $10^{-5}$.

Monitoring in Frequency Domain

In an optional or additional aspect of the present invention, the monitoring mode may comprise a cyclic signal emitted and/or received by an apparatus in a second state wherein at least a part of a plurality of the cyclic signal is converted from time domain to frequency domain by applying, for example, a Fourier transformation or a Laplacian transformation to the original signal, or Fourier analysis on the original signal (wherein the "original" signal refers to the space or time-domain signal emitted and/or received by the apparatus being monitored).

Once the cyclic signal emitted and/or received by the apparatus in a second state is in the frequency domain, the resulting frequency spectrum can be broken down into frequency intervals, i.e. "sampling" in frequency such that there are q intervals, each q interval encompassing a fixed or varying range of frequencies. At least one of the q intervals can be compared with its corresponding $p^{th}$ learnt distribution representing a first state; if more than a predetermined proportion, e.g. 95%, of the values of the qth interval lie within the learnt distribution of its corresponding $p^{th}$ interval, this may be indicative of the second state of the apparatus being the same as the first state of the apparatus. However, if less than a predetermined proportion of the $q^{th}$ interval lie within the learnt distribution of the corresponding $p^{th}$ interval, this may be indicative of the second state of the apparatus being different to the first state of the apparatus. Optionally, or additionally, if the $q^{th}$ interval in the second state has less than a predetermined probability of originating from the learnt distribution of the corresponding $p^{th}$ interval in the first state, said interval may be marked as "abnormal". If the number of abnormal intervals is above a predefined threshold, this is may be indicative of the second state being different to the first state. If the number of abnormal intervals is below a predefined threshold, this may be indicative of the second state being the same as the first state.

The $q^{th}$ interval in at least one of the frequency spectra representing a cycle (or at least part of a plurality of cycles of the cyclic signal) can be compared with the learnt distribution of the corresponding $p^{th}$ interval; if more than a predetermined proportion (e.g. 95%) of values of the $q^{th}$ interval of the frequency spectrum representing a plurality of cycles (or at least part of a plurality of cycles of the cyclic signal) lie within the learnt distribution of the corresponding $p^{th}$ interval, this may be indicative of the second state of the apparatus being the same as the first state of the apparatus. However, if less than a predetermined proportion of the $q^{th}$ interval of the frequency spectrum representing a plurality of cycles (or at least part of a plurality of cycles) lie within the learnt distribution of the corresponding $p^{th}$ interval, this may be indicative of the second state of the apparatus being different to the first state of the apparatus. Optionally, or additionally, if the $q^{th}$ interval in the second state has less than a predetermined probability of originating from the learnt distribution of the $p^{th}$ data point, said interval may be marked as "abnormal". If the number of abnormal data points is above a predefined threshold, this may be indicative of the second state being different to the first state. If the number of abnormal data points is below a predefined threshold, this may be indicative of the second state being the same as the first state.

One method for obtaining the frequency spectrum for either learning mode or monitoring mode is further clarified here. Ideally the cyclic signal emitted and/or received by the apparatus being monitored has been sampled at a sample rate of at least the Nyquist frequency, i.e. the sample rate is at least twice the highest frequency present in the signal emitted and/or received by the apparatus. At least a part of a plurality of a cyclic signal may be sampled in space or time-domain, and then transformed into frequency domain. Each resultant spectrum in frequency domain (i.e. the frequency spectrum) may be broken down into p intervals, each interval comprising a range of frequencies. This process of sampling at least a part of a plurality of a cyclic signal in space- or time-domain and then transforming the space or time-domain signal into frequency-domain comprising p intervals may be repeated. By repeating this process, statistical quantities such as the mean and/or standard deviation can be found for each $p^{th}$ interval such that the $p^{th}$ frequency interval may be distributed by a statistical distribution defined by the statistical quantities found. The statistical distribution may be created using central limit theorem or any other suitable statistical theory. This may be done for at least one of the p frequency intervals corresponding to the p intervals having a statistical distribution of the first state produced during the learning mode, or optionally, a machine learning model or algorithm, for example a random forest other decision support tool, may be employed such that only the optimal or necessarily or required intervals will have a corresponding distribution created. If the statistical distribution representing the second state falls outside of predetermined criteria relating to the statistical distribution representing the first state, this may be indicative that the second state of the apparatus is not the same as the first state of the apparatus, and therefore, an indication may be provided that the second state of the apparatus is not the same as the first state of the apparatus may be provided. If the statistical distribution representing the second state falls within predetermined criteria relating to the statistical distribution representing the first state, this may be indicative that the second state of the apparatus is the same as the first state of the apparatus, and therefore, an indication that the second state of the apparatus is the same as the first state of the apparatus may be provided.

Learning by Function Approximation

Optionally, or additionally, the learning mode of the present invention can involve the cyclic signal in space or time-domain or in frequency-domain (I.e. a frequency spectrum) being mapped onto a fixed signal—this may be referred to as "training". Training may optionally take place subsequent to the process of sampling at least a part of a plurality of the cyclic signal emitted and/or received by the apparatus or subsequent to pre-processing the cyclic signal or subsequent to the acquisition of the frequency spectrum. In one aspect of the present invention, subsequent to having sampled at least part of a plurality of the cyclic signal in space- or time-domain emitted and/or received by an apparatus (followed by optional pre-processing) or "sampling" (i.e. breaking up the frequency spectrum into intervals) at least part of a signal in frequency-domain emitted and/or received by an apparatus, said sampled signal may be mapped onto a fixed signal. The mapping may be applied during learning and/or monitoring the cyclic signal emitted and/or received by the apparatus. References to "training" in this application pertain to training a function approximator or a computer system for function approximation, for example, but not limited to, an artificial neural network, fuzzy, or neuro-fuzzy systems. This optional training of a function approximator has been shown to improve the accuracy of the distribution by around 7-15%. The learning mode by way of function approximation may be provided by the learning processing system.

The training process may be carried out for an apparatus in at least one operational state (i.e. the first state). Throughout this section, an example of an electric water pump will be used, however it is stressed that the present invention is not limited to electrical signals and may in fact be used for any cyclic or periodic or near (almost) periodic signal. The cyclic signal relating to a water pump is that of an AC power source for providing electrical power to the water pump. The water pump may be switched on to ensure that it is in an operational state. The electrical current from the AC power source drawn by the water pump may be sampled as described in the learning section above, i.e. a cyclic signal is sampled. Optionally, or additionally, the sampled signal may then be subject to a Fourier transform to provide a frequency spectrum broken up into frequency intervals.

Once the cyclic signal of the AC current has been sampled, as described in either learning mode sections in this application (i.e. in time domain or frequency domain), each single cycle (although at least a part of a plurality of cycles may alternatively be used) is passed through an algorithm, for example, a function approximator, wherein the function approximator may manifest as an artificial neural network fuzzy, or neuro-fuzzy systems, for example, an autoencoder. The cyclic signal may have been pre-processed as described in the learning section. In an example, an AC signal (the cyclic signal) has a frequency of 50 Hz, so with a sample rate of 10000 Hz, the number of data points per wavelength is 200 (although any other sample rate may be used, preferably at least the Nyquist sampling rate). The data of the electrical current signal (in time domain and/or frequency domain) is stored in a database on a computer-readable medium, and this data is "fed" to the function approximator which is stored on a computer-readable medium, i.e. the data is processed by the algorithm/function approximator. The function approximator is trained to map the at least part of a plurality of cyclic signals or at least part of a frequency spectrum onto a corresponding fixed signal of the same length (i.e. 200 data points in the water pump example or a corresponding number of frequency intervals), wherein the fixed signal may be any fixed signal of corresponding length to the at least a part of a plurality of cyclic signals or at least part of a frequency spectrum, for example, but not limited to, a random walk such as Brownian noise, white noise, or any other signal produced by a stochastic process or produced by a deterministic process. Preferably, the fixed signal is created only once and the same signal is used throughout training. The mapping is advantageous as the cyclic signal may not be a simple single sinusoidal waveform, but instead a combination of multiple sinusoidal waves, or the water pump, in keeping with the earlier example, may be a variable speed pump such that the current signal varies as the water pump speed is altered. The function approximator learns to map the at least one operational state signal onto the constant fixed signal. The function approximator receives, as an input, the data points associated with the at least part of a plurality of cyclic signals emitted and/or received by the apparatus or the values associated with the frequency intervals/ranges corresponding to the at least part of a plurality of cyclic signals emitted and/or received by the apparatus. The 'success' of the function approximator is measured by the difference between the function approximator's output and the fixed signal that was chosen prior to training. An error can be discovered by subtracting the fixed signal from the output, or vice versa, or the average squared difference between the corresponding data points (in space- or time-domain) or values (in frequency domain). When this error is very low, it is indicative of the input cyclic signal inputted into the function approximator being very closely matched to the fixed signal onto which it is being mapped. The training may conclude when the error in the mapping is reduced below a predetermined threshold, for example, below 10-7. Optionally, the training may conclude once a user decides as such.

Once the training has concluded, the fixed signal onto which the at least part of a plurality of cyclic signals or at least part of the frequency spectrum is mapped may be referred to as the trained signal (or the output of the function approximator). The fixed signal is ideally the same "length" as that of the input of the function approximator such that both the sampled cyclic signal and the fixed signal have the same number of data points, or similarly for the frequency domain case the fixed signal have the same number of data intervals. However, the number of data points/intervals in the fixed signal may be a factor or multiple of the number of data points/intervals in the cyclic signal or frequency spectrum representing the cyclic signal. For the example of the water pump, it is typical for the AC signal of the water pump to have some noise even in an operational state (wherein operational state refers to any state of the apparatus' operation), so the signal may fluctuate within limits, i.e. the nth point of the cyclic signal may have a range and is not necessarily a fixed point.

If a plurality (e.g. 10) of the at least part of a plurality of cyclic signals tor a plurality of a least a part of the frequency spectra are passed through the function approximator, this produces a corresponding plurality (e.g. 10) of fixed signals each of the same size as the at least part of a plurality of cyclic signals that were inputted (e.g. 200 data points each as each cycle of the AC signal single cycle input contains 200 data points) or each of the same size as the at least part of the frequency spectra (in some cases, use of a low or high pass filter may result in only part of the frequency spectra being used). The plurality of fixed signals may be averaged to create a single fixed signal of the same length/size as the input cyclic signal (e.g. 200 data points) or of a multiple or factor of the length/size of the input cyclic signal. This process may be repeated a plurality of times, for example 150 times. Therefore, in the water pump example, we have 150 averaged fixed signals produced from 150 sets of 10 AC signals. Additionally, as each fixed signal is created from the same number (or a multiple or a factor) of points/intervals as the input sampled cyclic signal or input frequency spectra, a statistical distribution, for example a normal distribution, can be learned for at least one or each of the data points/intervals as described in the learning section. It would be clear to a person skilled in the art of signal processing that many other suitable statistical theories can be employed to provide a statistical distribution.

Each of the averaged output signals (of which there are 150 in the water pump example) may have a length/size (e.g. 200) equal to that of the input signal. This information can be used to find the distribution of each point/interval via central limit theorem or any other suitable statistical theorem. An example of doing this is finding the mean and standard deviation of data point x by looking at the $n^{th}$ point in each of the fixed signals. Once the mean and/or the standard deviation of the $n^{th}$ point have been determined, the $n^{th}$ point can be expressed by a statistical distribution defined by the mean and standard deviation of the $n^{th}$ point, for example, a normal distribution. This is then repeated for each data point. Once this process is complete, there are a plurality (e.g. 200) of statistical distributions obtained in the water pump example. Each mean and/or standard deviation value (and/or associated values) may be stored on a database, wherein the database may be stored on a computer-readable medium. The values of the mean and standard deviation (and/or associated values) may be used in the monitoring stage.

Following the training procedure, the trained function approximator or trained computer system for function approximation (e.g. artificial neural network, fuzzy, or neuro-fuzzy systems, for example, but not limited to, an autoencoder) is able to map a cyclic signal onto a fixed signal. A vector of means and/or a vector of standard deviations (and/or associated values) whereby the vector length of each correspond to the length of the fixed signal are also be obtained.

Analogously, this method for learning mode by function approximation can be applied to a signal in frequency domain, i.e. the data points in space or time-domain are replaced by frequency intervals.

Monitoring by Function Approximation

The monitoring mode of the present invention is for monitoring the condition of apparatus while said apparatus is in operation in a second state. The monitoring mode by way of function approximation may be provided by the monitoring system processor.

Once the distribution of the at least one data point/interval in the at least part of a plurality of cyclic signals is known, i.e. a learnt distribution in a first state of the apparatus, we can test (i.e. monitor) another measured at least part of a plurality of cyclic signals emitted and/or received by said apparatus in a second state. By sampling the at least part of a plurality of cyclic signals in the same way as done for the first state (in the learning mode), there are the same number of data points/intervals per at least part of a plurality of the cyclic signal, e.g. 200 data points/intervals per single cycle in the water pump example. This can be done for a plurality of cycles. The nth point in each cycle (or at least part of a plurality of cycles of the cyclic signal) can be compared with the learning by function approximator distribution of the nth point; if more than a predetermined proportion (e.g. 95%) of the nth data points in a plurality of cycles (or at least part of a plurality of cycles of the cyclic signal) lie within the learnt distribution of the nth point, this may be indicative of the second state of the apparatus being the same as the first state of the apparatus. However, if less than a predetermined proportion of the nth data point in a plurality of cycles (or at least part of a plurality of cycles) lie within the learnt distribution of the nth point, this may be indicative of the second state of the apparatus being different to the first state of the apparatus. Optionally, if the nth data point in the second state has less than a predetermined probability of originating from the learnt distribution of the nth data point, said data point may be marked as "abnormal". If the number of abnormal data points is above a predefined threshold, this may be indicative of the second state being different to the first state. If the number of abnormal data points is below a predefined threshold, this may be indicative of the second state being the same as the first state. By analogy, the scenarios in this paragraph also apply to frequency intervals instead of data points, i.e. frequency intervals can be used interchangeably with data points.

Once a function approximator, or a computer system for function approximation, has been trained to map a cyclic signal in a first state to a fixed signal, the apparatus may be monitored to detect any abnormalities in a second state. The cyclic signal in a second state is sampled, as described above, such that each single cycle (or at least part of a plurality of cycles) comprises y data points. From this we may obtain a plurality of single cyclic signals (or at least a part of a plurality of cyclic signals), and each of these single cyclic signals (or each of these at least part of a plurality of cyclic signals) may be passed through the function approximator (e.g. artificial neural network, fuzzy, or neuro-fuzzy systems, e.g. autoencoder) such that an equal number (or factor or multiple number) of fixed signals each consisting of y data points (or multiple or factor of y data points) are produced. Each of these fixed signals are averaged to produce a single averaged signal of a size corresponding to y data points. Each data point of the single average fixed signal is then compared with its respective statistical distribution produced during the learning phase. This is to check whether each data point from a second state comes from its respective learnt distribution which was produced in a first state. If a data point in the second state has less than a threshold probability of originating from the learnt distribution (i.e. the second state is the same as the first state), said data point may be labelled as "abnormal", wherein the threshold probability is preferably between 0.01% and 20%, more preferably it is between 3% and 7%, and it is even more preferably 5%. Optionally, if the proportion of abnormal data points is above a predefined threshold which indicates that the cyclic signal is unlikely to be produced by the apparatus in at least one operational state, the equipment emitting and/or receiving the cyclic signal may be labelled as "abnormal" (i.e. the second state is different to the first state). Further optionally, if the proportion of abnormal data points is above a predefined threshold which indicates that the cyclic signal is unlikely to be produced by the apparatus in at least one operational state, the equipment emitting and/or receiving the cyclic signal may be labelled as regarded as being in another operational state. By analogy, the scenarios in this paragraph also apply to frequency intervals instead of data points, i.e. frequency intervals can be used interchangeably with data points.

An alternative, or parallel, method of monitoring a measured cyclic signal emitted and/or received by the apparatus in a second state is by sampling the cyclic signal in the same was as is described for learning in a first state, i.e. n data points per single cycle (or at least part of a plurality of cycles), and this process may be repeated at n points to provide n values for each repetition. A statistical distribution of the n data points (produced in the same way as described for the learning by function approximation method of obtaining a distribution for the nth data point, i.e. mapping the sampled cyclic signal onto a fixed signal) can be obtained, wherein the nth distributions of the n distribution(s) representing the second state of the apparatus may then be compared with their corresponding nth distribution(s) representing the first state of the apparatus. If the statistical distribution representing the second state falls outside of predetermined criteria relating to the statistical distribution representing the first state, this may be indicative that the second state of the apparatus is not the same as the first state of the apparatus, and therefore, an indication that the second state of the apparatus is not the same as the first state of the apparatus may be provided. If the statistical distribution representing the second state falls within predetermined criteria relating to the statistical distribution representing the first state, this may be indicative that the second state of the apparatus is the same as the first state of the apparatus, and therefore, an indication that the second state of the apparatus is the same as the first state of the apparatus may be provided. By analogy, the scenarios in this paragraph also apply to frequency intervals instead of data points, i.e. frequency intervals can be used interchangeably with data points.

Throughout this application, 'first state' is used to describe any of the states of the apparatus during the learning mode, and 'second state' is used to describe the any of the states of the apparatus during the monitoring mode.

Maintenance

The present invention does not necessarily require knowledge of a degraded operational or different operational or non-operational state (i.e. the second state) of the apparatus in order to identify such a state. The learning mode (by function approximation or otherwise) of the present invention can be completed solely for apparatus in at least one state. Optionally, the training phase may be completed for apparatus in each of a variety of operational and/or non-operational states in order for diagnosis of a failure or degradation to be more accurate when monitoring the apparatus, i.e. when the training phase is completed in at least one operational and/or non-operational state of the apparatus.

One aspect of the present invention is able to, via a function approximator or computer system for function approximation, map a cyclic signal corresponding to an apparatus' first operational state onto a fixed signal. When the apparatus is in a different operational state or non-operational state, the corresponding cyclic signal emitted or received by said apparatus changes relative to the cyclic signal emitted or received by said apparatus in the first operational state so the function approximator or computer system for function approximation has an increased error when mapping the cyclic signal onto a fixed signal. The increased error may be observed using any suitable statistical theory, for example, central limit theorem.

During or after the monitoring stage (with or without the function approximator), an indication system may indicate that the second state of the apparatus is different to the first state (or that the second state of the apparatus is the same as the first state) may be provided. The indication system may include, but is not limited to, a light and/or a sound. Preferably, a first indication is given for the scenario where the first state and second state are the same and a second indication is given for the scenario where the first state and the second state are different.

Optionally, or additionally, a user may be alerted of the status of the apparatus via an alert system. The alert may be activated at fixed or variable intervals, and/or the alert may be activated when the second state of the apparatus is different to the first state. The alert system may be an alarm system or a means of communication to a user by way of WiFi, Bluetooth, Zigbee, Z-Wave or any other wireless permissible communications.

If the second state of the apparatus is different to the first state of the apparatus, a diagnostic system may be activated. The diagnostic system may comprise a database comprising a library of states wherein the library of states comprises at least one learnt distribution of a cyclic signal emitted and/or received by an apparatus in at least one state. If the second state is the same as any of the states in the library of states, the diagnostic system may communicate as such via the indication system or the alert system. If there is no match between the second state and the library of states, a user may share the second state data. A user may upload the second state data to a shared database such that a user may download the learnt distribution of at least one state of the apparatus. The shared database may be shared with other users by storing the shared database on a server to provide a community with better trained apparatuses. The downloaded predetermined/learnt distribution(s) may be downloaded directly to a database stored on a computer-readable medium in communication with the at least one processor.

The apparatus may be provided with a library of states, for example, in the power supply adaptor (power plug) of the apparatus or in-line with the apparatus. Optionally, an apparatus may be provided with a learnt distribution for each of the at least one states of the apparatus. System such that the training is constantly happening, so faulty but operational apparatus can still have a non-operational state observed. Provided that the apparatus is operational (whereby non-crucial components of the apparatus may or may not be operational), the learning mode may continue such that a record of the signal emitted or received by an apparatus' may be recorded onto a data storage device, and such that only once the apparatus is in a non-operational state (whereby crucial components of the apparatus are not operational), an indication or alert is provided as such. Optionally, or additionally, an apparatus may be pre-trained to know all of the different faults such that only "critical" faults result in the activation of an alert or indication. The library of states may incorporate "allowances" for non-crucial components to develop faults without alerting a user or providing an indication of such a fault.

A first apparatus being monitored may also be configured to activate or deactivate at least one other apparatus based on the monitored signal emitted or received by the first apparatus. For example, the first apparatus may be an electric ignition of an gas stove. If, for example, the electric ignition develops a fault while in a monitoring mode, the gas stove may be configured to prevent any gas from the stove based on an indication from the condition monitoring system, i.e. if the second state of the apparatus is different to the first state of the apparatus such that it indicates that the apparatus is now in a faulty state, the apparatus may be switched off or relevant components of the apparatus may be disabled.

At least one of the indication system and the alarm system may be comprised by the learning processing system and/or the monitoring processing system.

Examples

Figure 7:
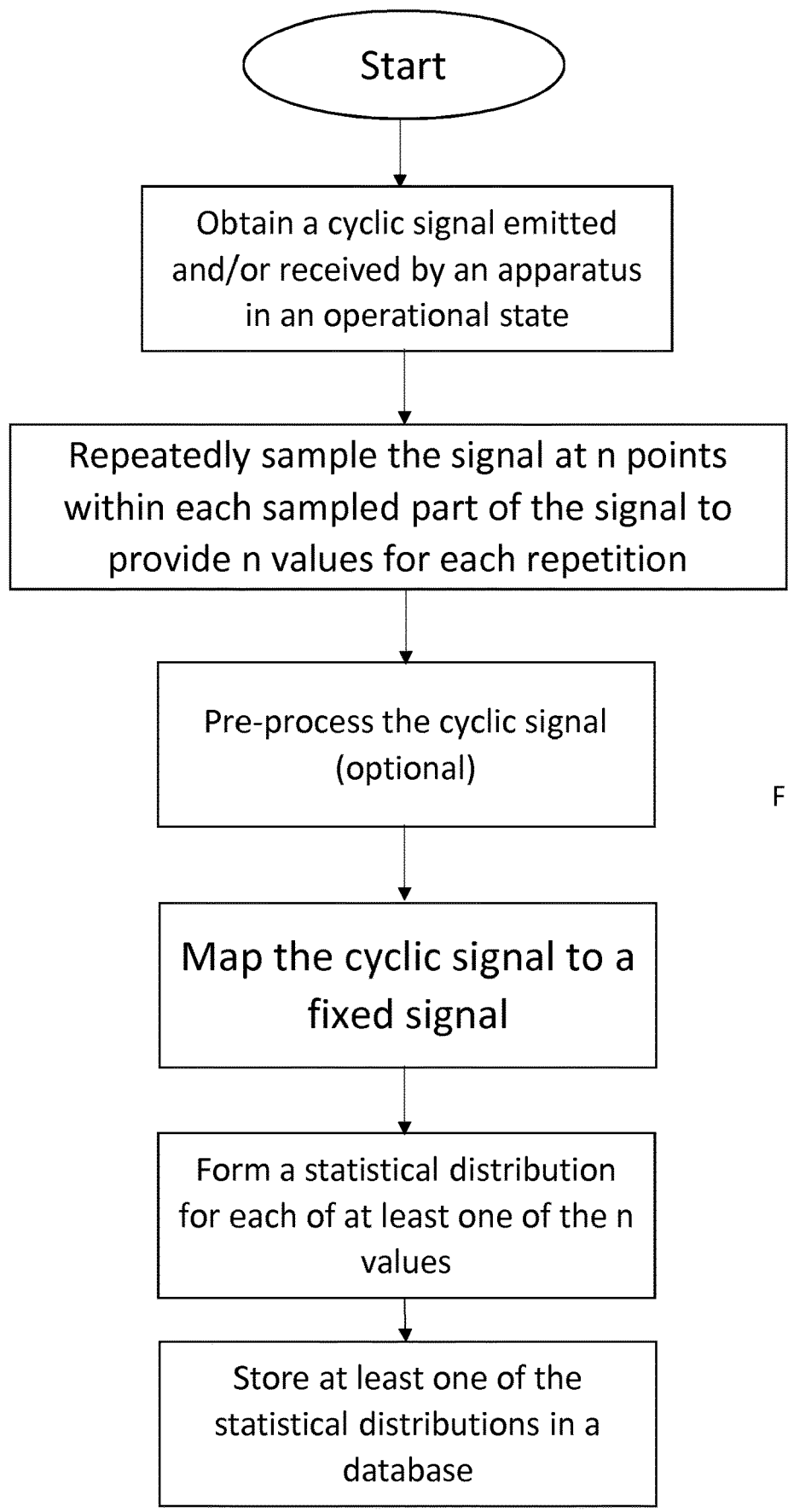
FIG. 7 is a block diagram of how the learning mode of the present invention may be implemented with a function approximator.
Figure 8:
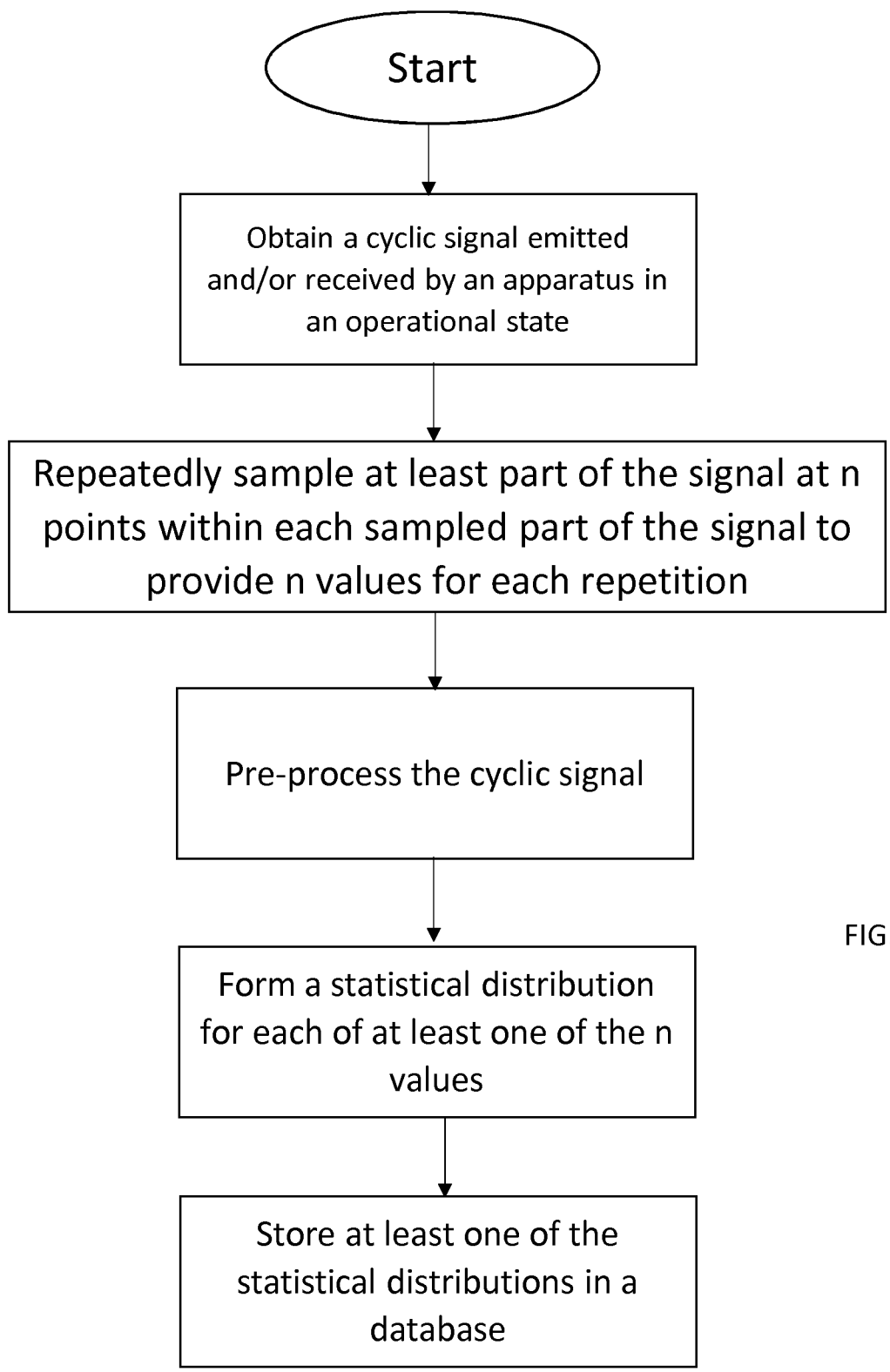
FIG. 8 is a block diagram of how the learning mode of the present invention may be implemented without a function approximator.
Figure 9:
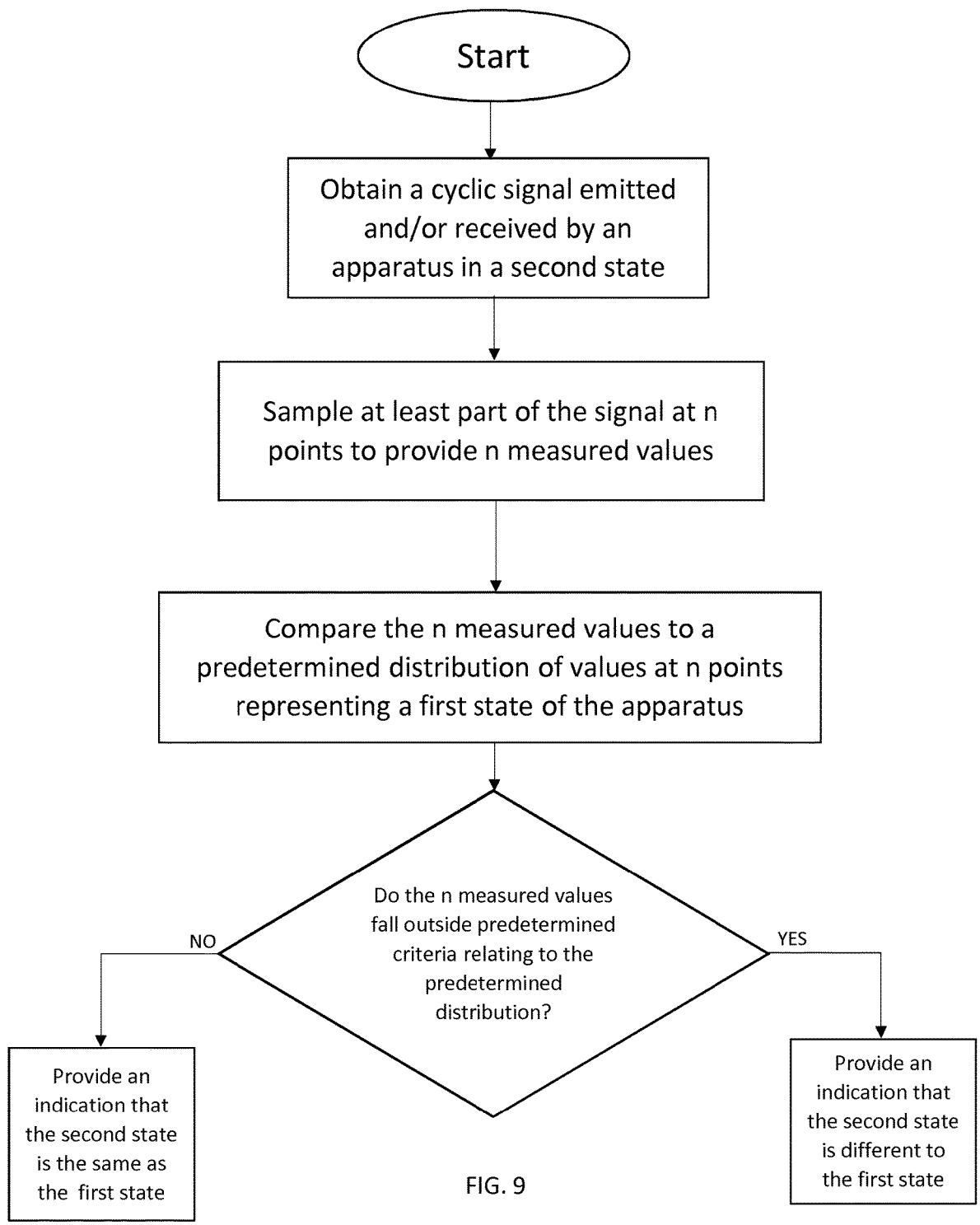
FIG. 9 is a block diagram of how the monitoring mode of the present invention may be implemented by comparing measured data points in a second state with a predetermined distribution representing a first state of the apparatus.
Figure 10:
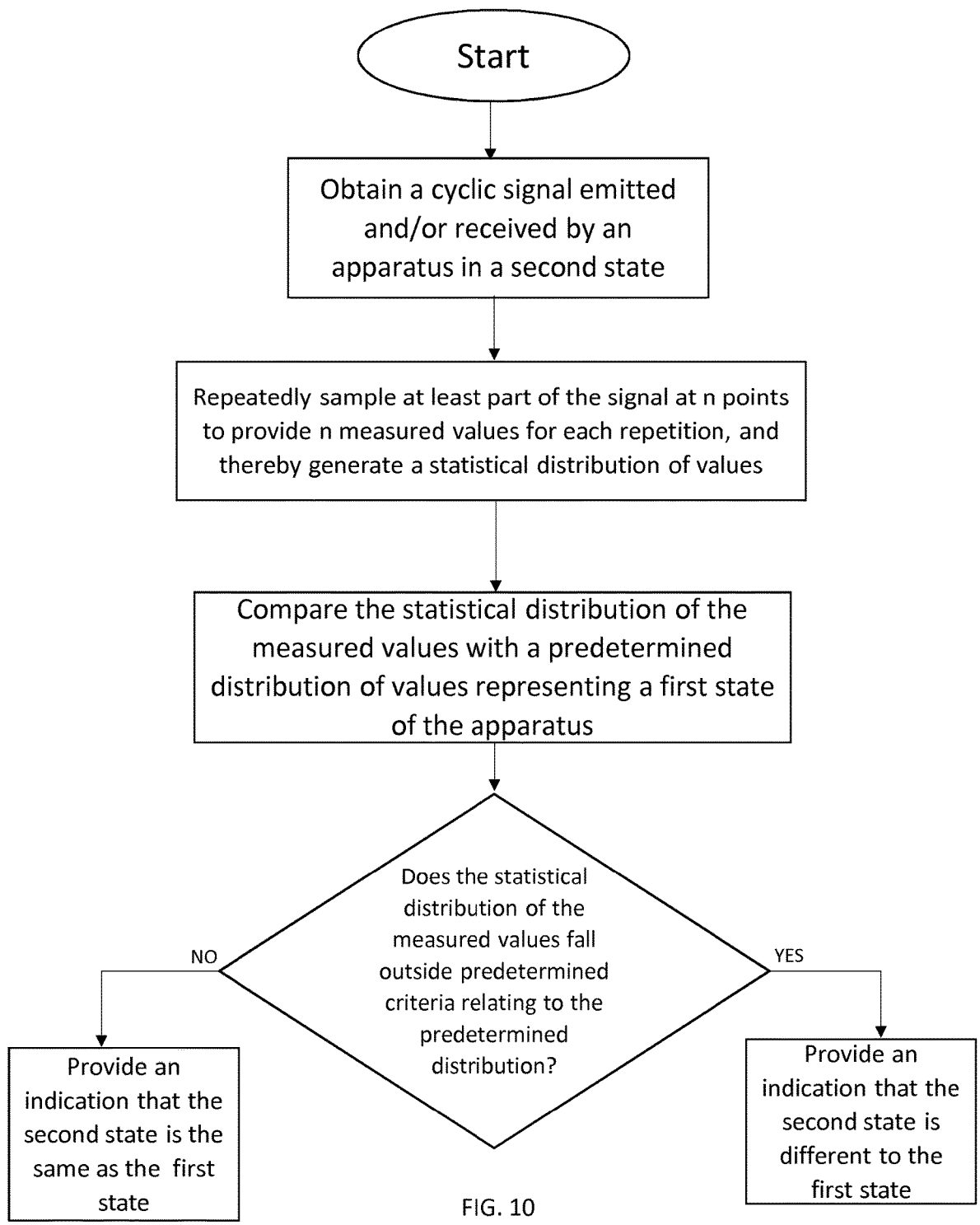
FIG. 10 is a block diagram of how the monitoring mode of the present invention may be implemented by comparing a statistical distribution representing a second state of the apparatus with a predetermined distribution representing a first state of the apparatus.
Figure 11:
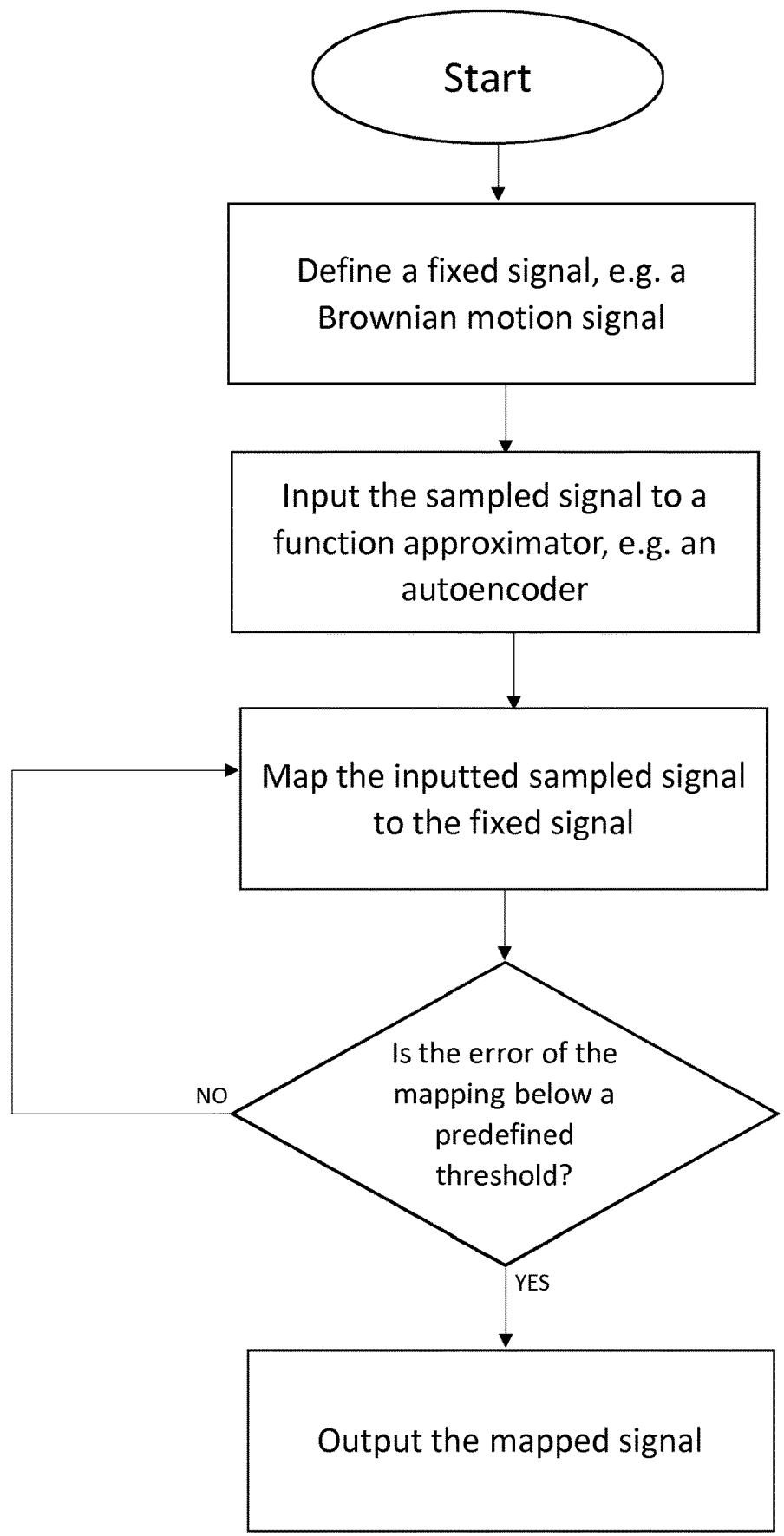
FIG. 11 is a block diagram of how the function approximator, i.e. means of mapping an input signal onto a fixed signal, of the present invention is implemented.
Figure 12:
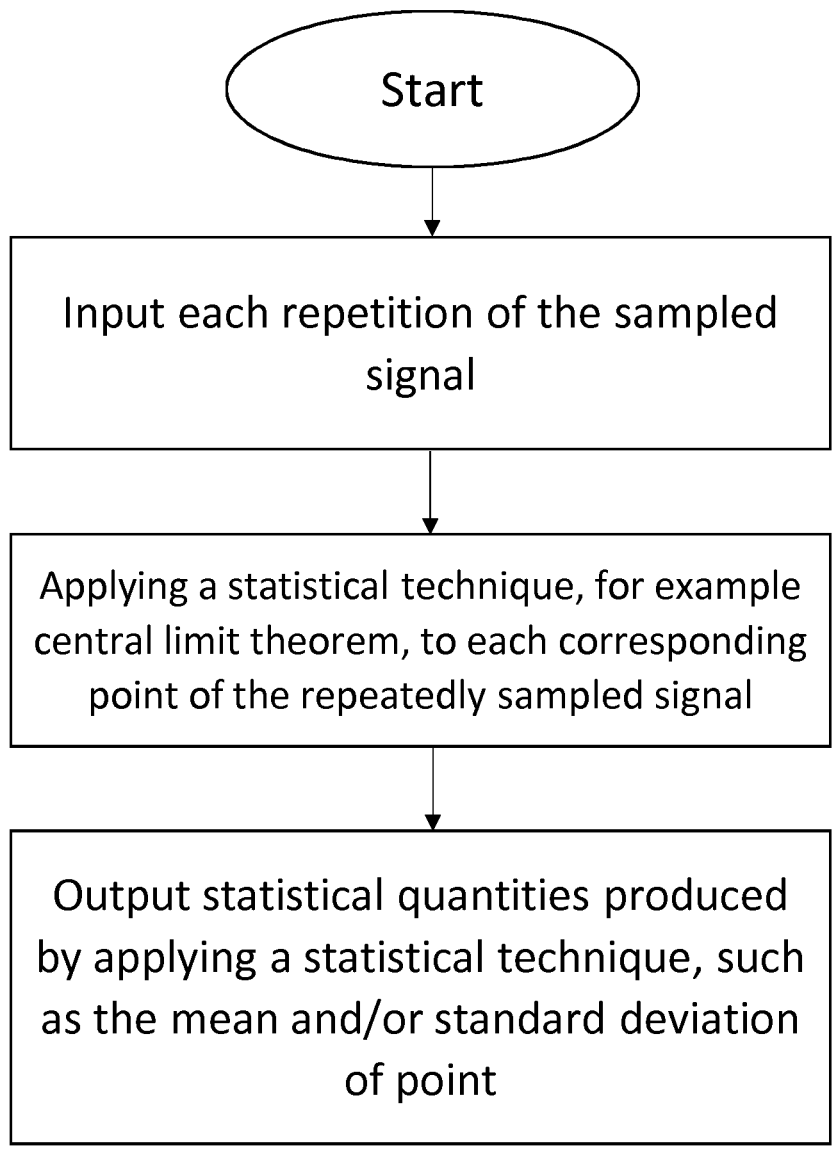
FIG. 12 is a block diagram of how a statistical technique, for example central limit theorem, of the present invention may be implemented.

FIGS. 7-12 are block diagrams depicting various examples of how different methods of the present invention may be implemented. FIG. 7 shows a block diagram of how the learning mode of the present invention may be implemented with a function approximator. FIG. 8 shows a block diagram of how the learning mode of the present invention may be implemented without a function approximator. FIG. 9 shows a block diagram of how the monitoring mode of the present invention may be implemented by comparing measured data points in a second state with a predetermined distribution representing a first state of the apparatus. FIG. 10 shows a block diagram of how the monitoring mode of the present invention may be implemented by comparing a statistical distribution representing a second state of the apparatus with a predetermined distribution representing a first state of the apparatus. FIG. 11 shows a block diagram of how the function approximator, i.e. means of mapping an input signal onto a fixed signal, of the present invention is implemented. FIG. 12 shows a block diagram of how a statistical technique, for example central limit theorem, of the present invention may be implemented.

The invention claimed is:

1. A method for monitoring the status of an electrical apparatus by processing, in a processor, an electrical AC signal emitted and/or received by said electrical apparatus, the method comprising:

sampling at least part of a plurality of cycles of the electrical AC signal at n points to provide n measured values, wherein the points are frequency intervals in a frequency spectrum representative of the electrical AC signal emitted and/or received by the electrical apparatus, wherein each frequency interval comprises a range of frequencies and wherein the frequency spectrum is obtained by a transformation into frequency domain;

comparing the n measured values to a predetermined distribution of values at said n points representing a first state of the electrical apparatus, wherein the first state corresponds to an operational state of the electrical apparatus; and responsive to determining that the n measured values fall outside predetermined criteria relating to the predetermined distribution:

deactivating the electrical apparatus or a component of the electrical apparatus; and providing an indication that the electrical apparatus is not in the first state and there is a likelihood of a fault, wherein the indication comprises providing a communication to a user.

2. A method as claimed in claim 1, wherein the electrical AC signal is mapped onto a fixed signal by means of a function approximator.

3. A method as claimed in claim 2, wherein the function approximator is an artificial neural network.

4. A method as claimed in claim 3, wherein the artificial neural network is an autoencoder.

5. A method as claimed in claim 1, wherein n samples of the electrical AC signal are mapped onto a fixed signal at n points to provide the n measured values.

6. A method as claimed in claim 5, wherein the fixed signal is a signal produced by a stochastic process.

7. A method as claimed in claim 6, wherein the stochastic process is Brownian noise.

8. A method for providing a statistical distribution or predetermined statistical distribution for use in the method of claim 1 by processing, in a processor, a measured electrical AC signal emitted and/or received by an electrical apparatus, comprising the steps:

i) repeatedly sampling at least part of a plurality of cycles of the electrical AC signal at n points within each sampled part of the electrical AC signal to provide n values for each repetition;

ii) forming a statistical distribution at a sampling interval in frequency domain of the n values across the repeatedly sampled parts of the electrical AC signal; and iii) storing the statistical distribution of the n values in a database;

whereby a statistical distribution indicative of the state of the electrical apparatus is obtained.

9. A device comprising a processor configured to effect the method of claim 8.

10. A system comprising a library of predetermined distributions corresponding to different electrical apparatus states, said predetermined distributions being retrievable for use in effecting the method of claim 1.

11. A system as claimed in claim 10, in which the different electrical apparatus states comprise:
   one or more states of the same electrical apparatus; or
   one or more states of different electrical apparatuses.

12. A device comprising a processor configured to effect the method of claim 1 using a remotely generated predetermined distribution.

13. A data product comprising a predetermined distribution for use in effecting the method of claim 1.

14. A method for monitoring the status of an electrical apparatus by processing, in a processor, an electrical AC signal emitted and/or received by said electrical apparatus, the method comprising:
   repeatedly sampling at least part of a plurality of cycles of the electrical AC signal at n points to provide n measured values for each repetition and thereby generate a statistical distribution of measured values, wherein the points are frequency intervals in a frequency spectrum representative of the electrical AC signal emitted and/or received by the electrical apparatus, wherein each frequency interval comprises a range of frequencies and wherein the frequency spectrum is obtained by a transformation into frequency domain;
   comparing the statistical distribution of the measured values with a predetermined distribution representing a first state of the electrical apparatus, wherein the first state corresponds to an operational state of the electrical apparatus; and
   responsive to determining that the statistical distribution of the measured values fall outside predetermined criteria relating to the predetermined distribution:
      deactivating the electrical apparatus or a component of the electrical apparatus; and
      providing an indication that the state of the electrical apparatus is not the same as the first state of the electrical apparatus and there is a likelihood of a fault, wherein the indication comprises providing a communication to a user.

15. A device comprising a processor, the processor configured to:
   sample at least part of a plurality of cycles of an electrical AC signal at n points to provide n measured values, wherein the electrical AC signal is emitted and/or received by an electrical apparatus, wherein the points are frequency intervals in a frequency spectrum representative of the electrical AC signal emitted and/or received by the electrical apparatus, wherein each frequency interval comprises a range of frequencies and wherein the frequency spectrum is obtained by a transformation into frequency domain;
   compare the n measured values to a predetermined distribution of values at said n points representing a first state of the electrical apparatus, wherein the first state corresponds to the operational state of the electrical apparatus; and
   responsive to determining that the n measured values fall outside predetermined criteria relating to the predetermined distribution:
      deactivate the electrical apparatus or a component of the electrical apparatus; and
      provide an indication that the electrical apparatus is not in the first state and there is a likelihood of a fault, wherein the indication comprises providing a communication to a user.

16. A device as claimed in claim 15, in which the processor is part of at least one of:
   a wall socket; or
   the electrical apparatus.

17. A device as claimed in claim 15, in which the processor is remote from the electrical apparatus and in communication with said electrical apparatus.

18. A device as claimed in claim 15, capable of receiving signals from an electrical apparatus, processing said signals, and of doing one or more of:
   sending information concerning the state of the electrical apparatus to said electrical apparatus;
   sending information concerning the state of the electrical apparatus to a remote site;
   presenting information concerning the state of the electrical apparatus.

19. A power plug for an electrical apparatus, comprising a processor configured to:
   sample at least part of a plurality of cycles of an electrical AC signal at n points to provide n measured values, wherein the electrical AC signal is emitted and/or received by an electrical apparatus, wherein the points are frequency intervals in a frequency spectrum representative of the electrical AC signal emitted and/or received by the electrical apparatus, wherein each frequency interval comprises a range of frequencies and wherein the frequency spectrum is obtained by a transformation into frequency domain;
   compare the n measured values to a predetermined distribution of values at said n points representing a first state of the electrical apparatus, wherein the first state corresponds to the operational state of the electrical apparatus; and
   responsive to determining that the n measured values fall outside predetermined criteria relating to the predetermined distribution:
      deactivate the component or a component of the electrical apparatus; and
      provide an indication that the electrical apparatus is not in the first state and there is a likelihood of a fault, wherein the indication comprises providing a communication to a user.

* * * * *